United States Patent [19]

Furuichi et al.

[11] 4,410,809
[45] Oct. 18, 1983

[54] STATIC INDUCTION TRANSISTOR GATE DRIVING CIRCUIT

[75] Inventors: Shuhei Furuichi, Shiga; Masakazu Suzuki, Nakamachi; Toshiaki Ikeda, Yahata, all of Japan

[73] Assignee: Kabushiki Kaisha Morita Seisakusho, Kyoto, Japan

[21] Appl. No.: 276,719

[22] Filed: Jun. 23, 1981

[30] Foreign Application Priority Data

Jun. 27, 1980 [JP] Japan .................................. 55-88059

[51] Int. Cl.³ ........................ H03K 3/01; H03K 17/60
[52] U.S. Cl. .................................. 307/255; 307/270; 307/299 R
[58] Field of Search ................... 307/270, 255, 299 R, 307/253

[56] References Cited

U.S. PATENT DOCUMENTS 3,065,358  11/1962  Lee et al. ............................. 307/270
4,347,445   8/1982  Baker .................................. 307/255

FOREIGN PATENT DOCUMENTS 54-102859   8/1979  Japan .................................. 307/255
54-134547  10/1979  Japan .................................. 307/270

Primary Examiner—Stanley D. Miller
Assistant Examiner—B. P. Davis
Attorney, Agent, or Firm—Koda and Androlia

[57] ABSTRACT

The disclosure relates to a gate driving circuit for a depletion type, static induction transistor, including a capacitor coupled between the emitters of complementary-connected NPN and PNP transistors and the SIT gate, high value resistor parallel-connected to a series connection of a diode and a resistor between the SIT gate, and a negative gate voltage source.

2 Claims, 5 Drawing Figures

STATIC INDUCTION TRANSISTOR GATE DRIVING CIRCUIT

BACKGROUND OF THE INVENTION

1. Field of the Invention

This invention relates to an SIT (static induction transistor) gate driving circuit and more particularly to a switching circuit which can deliver the maximum switching characteristics of a depletion type SIT when it is used as a switching device.

2. Prior Art

The static induction transistor (hereinafter referred to as "SIT") is a kind of vertical field effect transistors (hereinafter referred to as "FET") and a multiple carrier device. It has superior characteristics as a switching device, since it does not cause secondary breakdown and does not have storage time which are defects inherent in bipolar transistors. However, this transistor has a high capacity between the drain and gate or the gate and source, so different from ordinary bipolar transistors, it is difficult to drive the SIT gate, and the switching performance of the SIT is greatly dependent on the gate driving method. As a result, the applications of SITs are extremely limited.

FIG. 1 is a cross-sectional view of a vertical junction FET. As shown in the figure, the source is located over the N-channel and the drain D is below the N-channel. In the middle, the gate G of a filament- or grid-like P-type semiconductor is formed. Since the SIT has the electrical characteristics of a depletion type, that is, "Normally ON" characteristics, when a voltage is applied between the drain D and the source S, a drain current flows unless a sufficient negative voltage is applied to the gate. Therefore, when the SIT is used as a switching device, it is necessary to apply a sufficient negative voltage to set the device in an non-operation state (OFF state).

As can be clearly shown in the sectional view of FIG. 1, the area between the drain D and the source S is equivalent to a capacitor with the channel area Ch as a dielectric in the OFF state. In the same way, the area between the gate G and the drain D and the area between the gate G and the source S form capacitors.

Accordingly, in the switching operation from the OFF to ON state, the charge stored in the capacitors must be discharged speedily to switch the device to the OFF state quickly. This discharging time is one of the greatest factors which prevents the switching-on time from being shortened. In the switching operation from the ON to OFF state, since current flows in the form of multiple carriers through the channel Ch during the ON state, the charge of these carriers must be taken out of the gate G to quickly switch the device from the ON to OFF state. This time required for taking out carriers is one of the greatest factors which prevents the switching-off time from being shortened in the same way as the discharging time required when the capacitor charge is discharged immediately after switching from the OFF to ON state.

FIG. 2 is a transformer coupling drive circuit embodying a known gate driving circuit. Since the circuit is driven by the transformer T1, this circuit has defects such as ringing or defective rising state during switching from the OFF to ON state of SIT1 and SIT2 due to effects of the coil of the driving transformer T1.

FIG. 3 shows an improved circuit embodying a known gate driving circuit. With this circuit, the pulse signal from the driving source 22 is amplified by the transistor Q21 and drives the driving transistor Q22 to further drive the SIT. To set the SIT to the OFF state, the transistor Q22 is turned ON and the negative voltage E23 is applied to the gate of the SIT. To set the SIT to the ON state, the transistor Q22 is turned OFF and the positive voltage E22 is applied to the gate through the resistor R25. With this driving circuit, during SIT switching from the ON to OFF state, the transistor Q22 turns ON to take out carriers from the gate of SIT, sufficiently shortening the OFF time. However, during SIT switching from the OFF to ON state, the charge stored in the area between the gate G and source S during the OFF period are discharged through the resistor R25. Accordingly, switching-on time is depended on the time constant determined by the resistor R25 and the electrostatic capacity $C_{GS}$.

Therefore, switching-on time is prolonged unless a resistor R25 with a sufficiently low value is used. Furthermore, surge voltages, etc. may sometimes be generated by the load 21 depending on kinds of loads, and may appear at the gate through the capacity $C_{GS}$ between the drain and gate. This leaked surge voltage may damage the transistor Q22. Once the transistor Q22 is damaged, the negative voltage E23 is not applied. As a result, the SIT is set to the ON state all the time, and damaged in a short time due to excessive drain dissipation.

SUMMARY OF THE INVENTION

Accordingly, it is an object of the present invention to provide an SIT gate driving circuit having significantly higher reliability.

It is another object of the present invention to provide an SIT gate driving circuit which is capable of driving an SIT at SIT's maximum switching speed in safety.

These objects are achieved by an SIT gate driving circuit which includes complementary-connected NPN and PNP transistors of which respective collectors are connected to an SIT source voltage source and a negative voltage source which can sufficiently cut off the SIT, a capacitor connected between the gate of the SIT and the emitters common to both the NPN and PNP transistors, a high value resistor directly connected between the gate of the SIT and the negative voltage source and a series connection of a diode and a resistor parallel-connected to said high value resistor, whereby the SIT gate driving circuit is constructed to switch the SIT by driving the NPN and PNP transistors alternately.

DETAILED DESCRIPTION OF THE INVENTION

A detailed description will now be given of an embodiment of the driving circuit with reference to the accompanying drawings.

Figure 1:
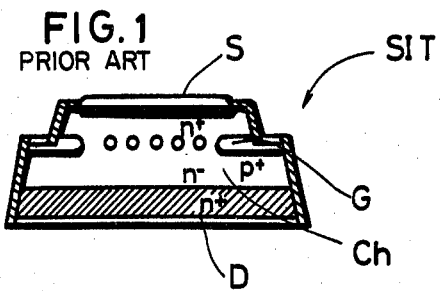
FIG. 1 is a sectional view showing a SIT.
Figure 2:
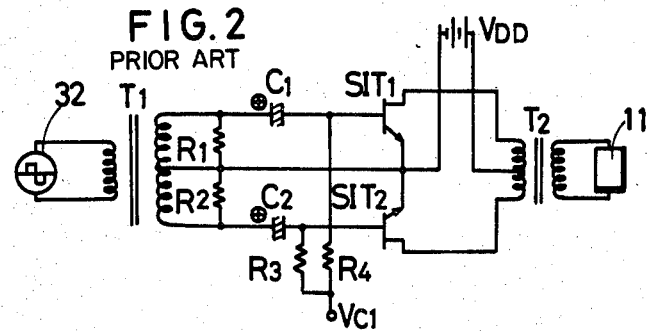
FIG. 2 shows an embodiment of a known SIT gate driving circuit.
Figure 3:
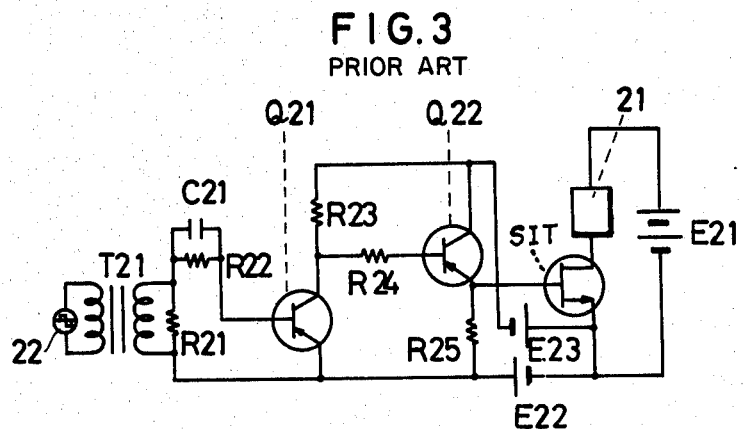
FIG. 3 shows another embodiment of a known SIT gate driving circuit.
Figure 4:
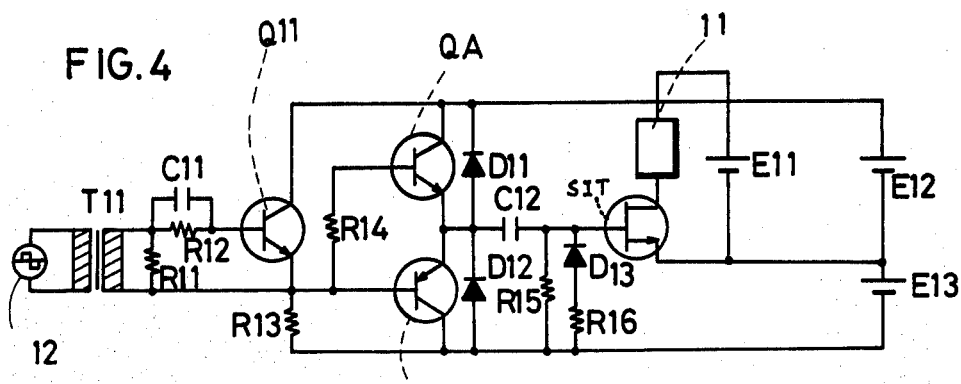
FIG. 4 shows an embodiment of a SIT gate driving circuit of this invention.

FIG. 4 shows an embodiment of a drive circuit of the present invention. The driving transistor Q11 amplifies a pulse signal from the driving transistor Q11 amplifies a pulse signal from the driving power source 12 and switches the NPN and PNP transistors alternately. With this circuit, since the input to the transistor Q11 is applied across the base and emitter without passing through the resistor R13, feedback by the resistor R13 is not performed and the gain increases. At the driving time, the output is taken out of the emitter to turn ON the lower transistor QB of the drive stage when input pulses are not present. When the transistor Q11 is ON, the transistor QA is turned ON and the transistor QB is turned OFF. A current through the collector and emitter of the transistor Q11 and the resistor R14 is supplied to the base of the transistor QA. When the driving transistor Q11 is OFF, the transistor QB is turned ON and the transistor QA is turned OFF. A current through the resistor R13 is supplied to the base of the transistor QB. The resistors R13 and R14 are used to independently adjust the base currents to the transistors QA and QB to the optimum values.

The diodes D11 and 12 are protection diodes which prevent application of reverse voltages to the transistors QA and QB. The emitters of the transistors QA and QB are commonly connected. The capacitor C12 couples the emitters and the SIT gate.

The high value resistor R15, parallel-connected with a series connection of the diode D13 and resistor R16, has a resistance not affecting the circuit and functions to prevent the SIT from being kept on when the switching transistors QA and QB of the driving stage are damaged and a negative voltage is not present. This greatly improves reliability of the driving circuit of the invention.

Figure 5:
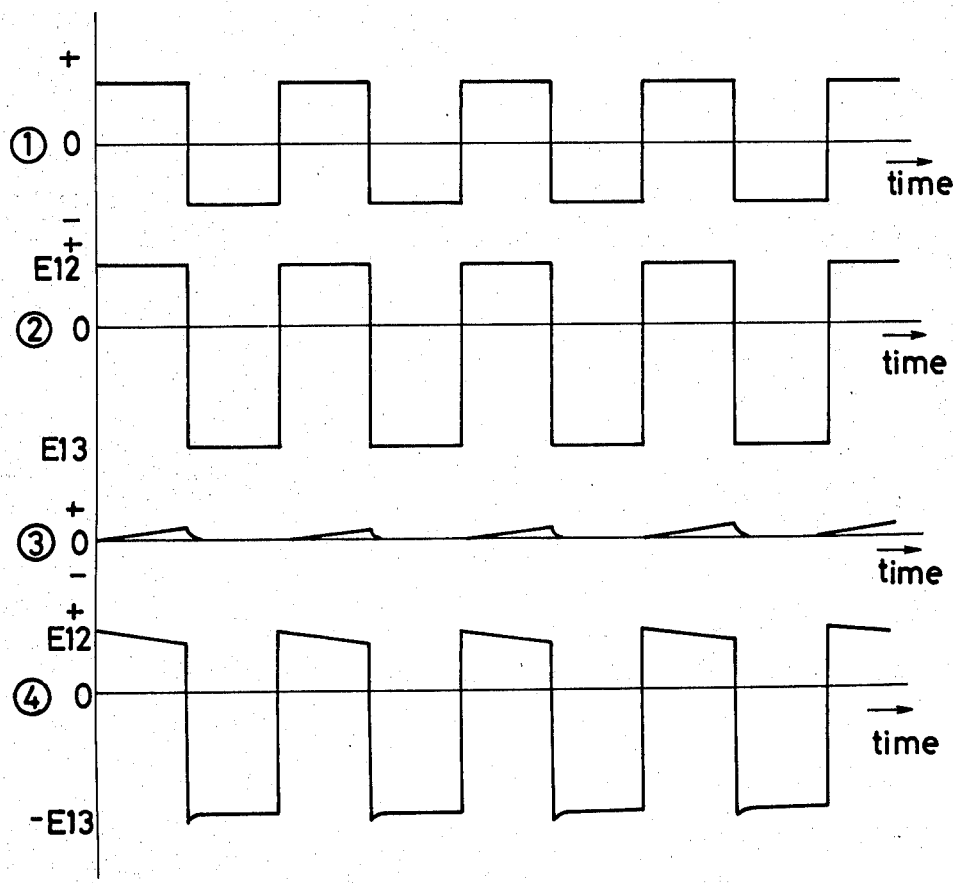
FIG. 5 shows waveforms indicating the operating principle of the electrical circuit shown in FIG. 4, wherein FIG. 5 ① shows an output signal waveform of a drive pulse source, FIG. 5 ② shows an emitter voltage variation of switching transistors QA and QB, FIG. 5 ③ shows a voltage across a coupling capacitor, and FIG. 5 ④ shows a SIT operating waveform.

FIG. 5 shows the operating principle of the driving circuit of the invention. FIG. 5①  shows a pulse signal from the driving power supply 12. FIG. 5② shows the emitter voltage of the switching transistors QA and QB of the driving stage. The voltage level is switched between the voltage E12 and E13 applied to the collectors of the respective transistors, in synchronous with the input pulse signal shown in FIG. 5①. FIG. 5③ shows the voltage across the coupling capacitor C12, with the left terminal designated as the positive side. When the SIT is driven to the state, since the junction between the gate and source is equivalent to the forward-biased junction of a diode, a voltage appears across the capacitor C12. With the SIT OFF, since the gate-source junction is equivalent to a reverse-biased junction of a diode, when the switching transistor QB is turned ON and after carriers are taken out of the gate through the capacitor C12, no current flows and the voltage across the capacitor C12 remains.

This voltage causes fluctuation of the driving operating point each time the SIT turns ON and OFF. To prevent this fluctuation, the discharging circuit comprising a series connection of the diode D13 and resistor R16 and the capacitor C12 discharges unnecessary charge when the switching transistor QB is ON to provide the SIT gate driving waveform with a stable operating point, as shown in FIG. 5④.

As described above, since the driving circuit of the invention drives the SIT through the coupling capacitor and applies a negative voltage through the high value resistor R15, even when the drive stage transistors QA and QB are damaged, this circuit will just stop operating without damaging the SIT, enabling driving operation with higher reliability. When the SIT is switched from the OFF to ON state, the positive voltage E12 is applied through the collector and emitter of the switching transistor QA which is in the ON state. When the SIT is switched from the ON to OFF state, the negative voltage E13 is applied through the collector and emitter of the switching transistor QB which is in the ON state.

Accordingly, the internal resistance is low in both cases. In the former case, charge is discharged quickly and in the latter case, carriers can be taken out quickly. As a result, this driving circuit is capable of driving the SIT at SIT's maximum switching speed in safety.

Furthermore, the driving circuit of the present invention is applicable to not only static induction transistors (junction type vertical field effect transistors) but also other depletion type power devices which have a high capacity between the gate and source or the gate and drain. The circuit features significantly high reliability.

We claim:

1. A static inductor transistor (junction type vertical field effect transistor) gate driving circuit comprising:
    a complementary-connected NPN and PNP transistors of which respective collectors are connected to a positive voltage source and a negative voltage source which can sufficiently cut off the static induction transistor, so that the transistors can be driven alternately;
    a capacitor connected between the gate of said static induction transistor and the emitters common to both NPN and PNP transistors;
    a high value resistor directly connected between the gate of said static induction transistor and said negative voltage source; and
    a series connection of a diode and a resistor parallel-connected to said high value resistor;
    whereby said static induction transistor gate driving circuit is constructed to switch said static induction transistor by driving said NPN and PNP transistors alternately.

2. An static induction transistor gate driving circuit according to claim 1, wherein said driving circuit comprises reverse-voltage protection diodes additionally connected between the collector and emitter of each transistor of said complementary-connected NPN and PNP transistors.

* * * * *